United States Patent
Lee et al.

(10) Patent No.: US 10,784,458 B1
(45) Date of Patent: Sep. 22, 2020

(54) ORGANIC LIGHT-EMITTING DIODE WITH ENHANCED LIGHT-EMITTING EFFICIENCY AND COLOR PURITY

(71) Applicants: Yuan Ze University, Chung-Li (TW); Nichem Fine Technology Co, Ltd., Jhubei, Hsinchu County (TW); WISECHIP SEMICONDUCTOR INC., Zhunan Township, Miaoli County (TW); Tetrahedron Technology Corporation, Zhunan Township, Miaoli County (TW); SHINE MATERIALS TECHNOLOGY CO., LTD., Kaohsiung (TW)

(72) Inventors: Jiun-Haw Lee, Chung-Li (TW); Tien-Lung Chiu, Chung-Li (TW); Chia-Hsun Chen, Chung-Li (TW); Pei-Hsi Lee, Chung-Li (TW)

(73) Assignees: YUAN ZE UNIVERSITY, Chung-Li (TW); NICHEM FINE TECHNOLOGY CO., LTD., Jhubei (TW); WISECHIP SEMICONDUCTOR INC., Zhunan Township (TW); TETRAHEDRON TECHNOLOGY CORPORATION, Zhunan Township (TW); SHINE MATERIALS TECHNOLOGY CO., LTD., Kaohsiung (TW)

(*) Notice: Subject to any disclaimer, the term of this patent is extended or adjusted under 35 U.S.C. 154(b) by 0 days.

(21) Appl. No.: 16/354,826

(22) Filed: Mar. 15, 2019

(51) Int. Cl.
  *H01L 51/50* (2006.01)
  *H01L 51/00* (2006.01)

(52) U.S. Cl.
  CPC ........ *H01L 51/504* (2013.01); *H01L 51/0058* (2013.01); *H01L 51/0081* (2013.01);
  (Continued)

(58) Field of Classification Search
  CPC ............... H01L 51/504; H01L 51/0058; H01L 51/0081; H01L 51/5004; H01L 51/5056; H01L 51/5072; H01L 51/5096
  (Continued)

(56) References Cited

U.S. PATENT DOCUMENTS

2002/0146589 A1* 10/2002 Akiyama ............ H01L 51/5012
   428/690
2009/0200925 A1* 8/2009 Naito ...................... H01L 51/50
   313/504

(Continued)

*Primary Examiner* — Didarul A Mazumder
(74) *Attorney, Agent, or Firm* — Birch, Stewart, Kolasch & Birch, LLP

(57) ABSTRACT

An organic light-emitting diode including an anode, a cathode, and a luminescent layered structure disposed between the anode and the cathode. The luminescent layered structure has a luminescent layer, a sensitizer layer and a guiding material. The luminescent-layer singlet state is two times higher than the luminescent-layer triplet state. The sensitizer layer has a sensitizer-layer triplet state between the luminescent-layer singlet state and the luminescent-layer triplet state. The guiding material has a guiding-material triplet state between the sensitizer-layer singlet state and the sensitizer-layer triplet state. The energy of molecules at the sensitizer-layer singlet state is transferred to the guiding-material triplet state and then to the sensitizer-layer triplet state, which is then transferred to the luminescent-layer triplet state and triggers triplet-triplet annihilation upconversion in the luminescent layer such that the luminescent layer emits light of a first color.

17 Claims, 5 Drawing Sheets

(52) U.S. Cl.
CPC ...... *H01L 51/5004* (2013.01); *H01L 51/5056* (2013.01); *H01L 51/5072* (2013.01); *H01L 51/5096* (2013.01)

(58) Field of Classification Search
USPC .................................. 257/40; 438/82, 99
See application file for complete search history.

(56) References Cited

U.S. PATENT DOCUMENTS

| | | | |
|---|---|---|---|
| 2011/0049367 A1* | 3/2011 | Forrest | H01L 51/0035 250/338.4 |
| 2014/0077172 A1* | 3/2014 | So | H01L 51/5016 257/40 |
| 2015/0076360 A1* | 3/2015 | Menge | G01T 1/20 250/390.11 |
| 2016/0197282 A1* | 7/2016 | Tanimoto | C09K 11/025 257/40 |
| 2018/0051204 A1* | 2/2018 | Ogiwara | C09K 11/06 |
| 2018/0212157 A1* | 7/2018 | Oshiyama | C07D 413/10 |

\* cited by examiner

ORGANIC LIGHT-EMITTING DIODE WITH ENHANCED LIGHT-EMITTING EFFICIENCY AND COLOR PURITY

FIELD OF THE INVENTION

The present invention relates to a light-emitting diode, and specifically to an organic light-emitting diode.

BACKGROUND OF THE INVENTION

A typical organic light-emitting diode (OLED) is formed of several stacked nano-size layers including an anode, a hole transport layer (HTL), a luminescent layer, an electron transport layer (ETL) and a cathode in spatial order. When a voltage is applied to an OLED, a current of holes flows from the anode to the highest occupied molecular orbitals (HOMO) of the HTL, thus generating positive polarons, and a current of electrons flow from the cathode to the lowest unoccupied molecular orbitals (LUMO) of the ETL, thus generating negative polarons. The positive polarons and the negative polarons recombine in the luminescent layer, thereby generating singlet excitons and triplet excitons. Thereafter, the singlet excitons return to the ground state, upon which light is emitted.

In the evolution of OLEDs, extending the lifetime of blue OLEDs has been a key issue, the reason being that the energy of blue photons is relatively high, which results in the property of rapid degradation. To be specific, active exciton-polaron annihilation exists in blue OLEDs since excitons possess long lifespan and thus tends to react with excitons, forming high energy polarons that break molecular bonds in the luminescent material and consequently reduce the lifetime of blue OLEDs.

In addition, light is emitted when singlet excitons return to the ground state, while triplet excitons in fluorescent materials cannot return to ground state with photon emission. That is to say, a considerable amount of energy is wasted taking into consideration of the fact that triplet excitons account for 75 percent of excited excitons as a result of the recombination of positive polarons and negative polarons.

Therefore, OLEDs of prior art still have room for improvement.

SUMMARY OF THE INVENTION

The objective of the present invention is to provide an organic light-emitting diode which emits light utilizing the triplet energy thereof, thereby extending the lifetime of the organic light-emitting diode. Furthermore, the organic light-emitting diode transfers singlet state energy to triplet state energy, which contributes to the light emission as well, thereby further enhancing the light-emitting efficiency and color purity.

One embodiment of the present embodiment provides an organic light emitting diode including an anode, a cathode and a luminescent layered structure. The luminescent layered structure is disposed between the anode and the cathode. The luminescent layered structure has a luminescent layer, a sensitizer layer, and a guiding material. The luminescent layer has a luminescent-layer ground state, a luminescent-layer singlet state and a luminescent-layer triplet state, in which the luminescent-layer singlet state is two times higher than the luminescent-layer triplet state. The sensitizer layer has a sensitizer-layer triplet state, which is between the luminescent-layer singlet state and the luminescent-layer triplet state. The guiding material has a guiding-material triplet state between the sensitizer-layer singlet state and the sensitizer-layer triplet state. The molecules of the sensitizer layer at the sensitizer-layer singlet state transfer energy to the molecules of the guiding material at the guiding-material triplet state, in which the transferred energy is further transferred to the molecules of the sensitizer layer at the sensitizer-layer triplet state. The molecules of the sensitizer layer at the sensitizer layer triplet layer transfers energy to the molecules of the luminescent layer at the luminescent-layer triplet state and triggers triplet-triplet annihilation upconversion in the luminescent layer such that the luminescent layer emits light of a first color.

To further understand the features and technical content of the present invention, please refer to the following detailed descriptions and drawings related to the present invention. However, the provided drawings are used only for providing reference and descriptions, and are not intended to limit the present invention.

DETAILED DESCRIPTION OF THE PREFERRED EMBODIMENTS

Embodiments of the present invention are described below with reference to FIG. 1 to FIG. 8. A person skilled in the art can understand the advantages and effects of the present invention from the description disclosed below. However, the content disclosed below is not intended to limit the protection scope of the present invention. The present invention can be implemented by a person skilled in the art based on different perspectives and applications without departing from the concept and spirit of the present invention. In addition, it should be stated in advance that the accompanying drawings of the present invention are merely used for illustration, and are not drawn according to actual dimensions for sake of clear illustration. Moreover, the same reference number corresponds to the same component. It should also be understood that expressions such as one component is "connected to" or "disposed on" another may mean that the former is either directly or indirectly connected to or disposed on the latter, wherein "connected" may refer to either physical or electrical connection.

First Embodiment

Figure 1:
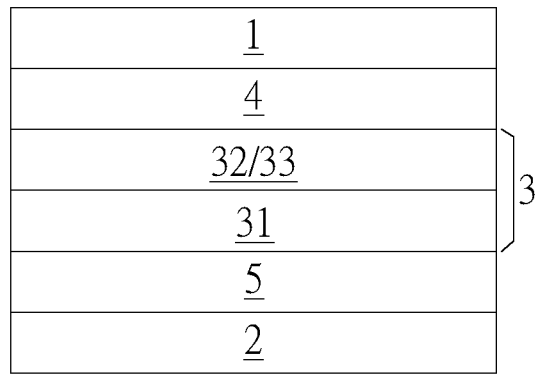
FIG. 1 is a schematic view illustrating an organic light-emitting diode according to a first embodiment of the present invention.
Figure 2:
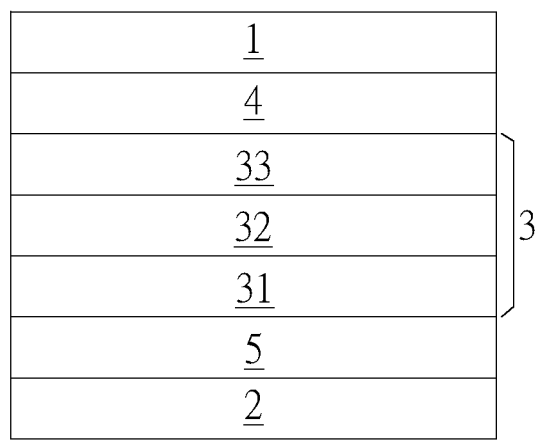
FIG. 2 illustrates a variant embodiment of the organic light-emitting diode according to the first embodiment of the present invention.
Figure 3:
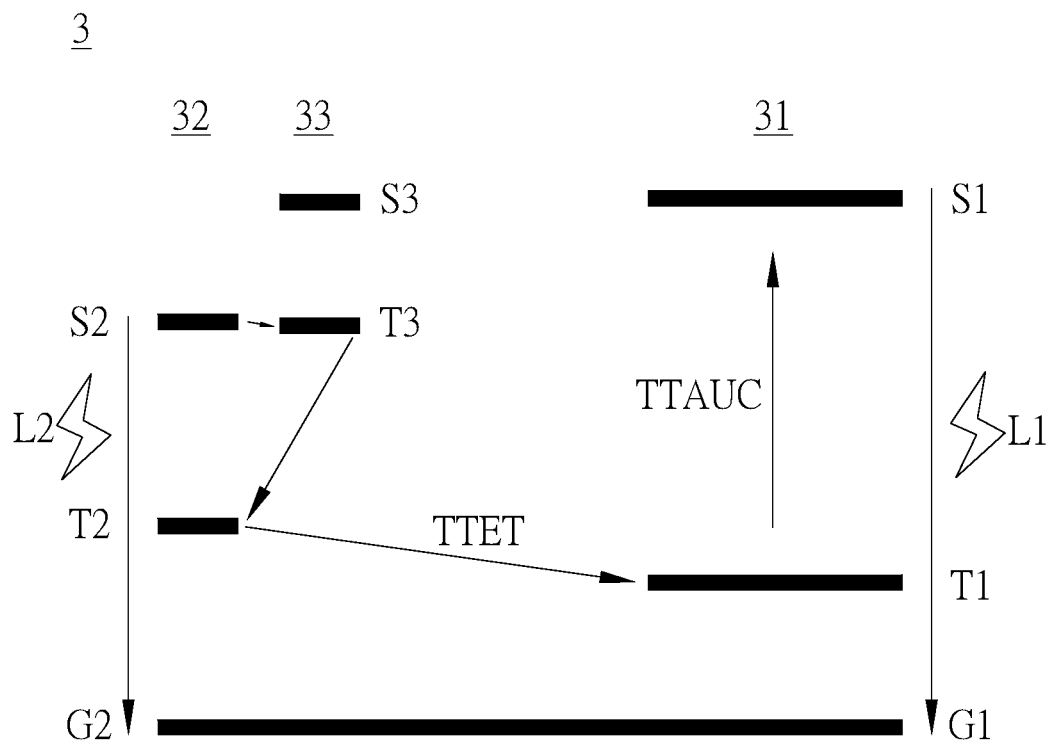
FIG. 3 illustrates a luminescent layered structure of a first experimental example according to the first embodiment of the present invention.

The organic light-emitting diode Z according to the first embodiment of the present invention is described between with reference to FIG. 1 to FIG. 3. First of all, referring to FIG. 1, the organic light-emitting diode Z provided by the first embodiment of the present invention includes an anode 1, a cathode 2, a luminescent layered structure 3, a hole transport layer 4 and an electron transport layer 5. The hole transport layer 4 is disposed between the anode 1 and the luminescent layered structure 3, and the electron transport layer 5 is disposed between the cathode 2 and the luminescent layered structure 3.

As shown in FIG. 1, the luminescent layered structure 3 has a luminescent layer 31, a sensitizer layer 32, and a guiding material 33. The luminescent layer 31 includes a luminescent-layer ground state, a luminescent-layer singlet state and a luminescent-layer triplet state. Specifically, in the present embodiment, the luminescent layer 31 is a TTA material layer, that is to say, the luminescent-layer singlet state is two times higher than the luminescent-layer triplet state. More specifically, the luminescent layer 31 is preferably made of an anthracene derivative, a pyrene derivative or a perylene derivative; however, the present invention is not limited thereto. The anthracene derivative may be but not limited to 9,10-Di(2-naphthyl)anthracene (ADN), 2-methyl-9,10-D(2-naphthyl)anthracene, 2-tert-butyl-9,10-Di(2-naphthyl)anthracene, or 9,9'-dianthracene.

In the embodiment shown in FIG. 1, the sensitizer layer 32 is disposed between the luminescent layer 31 and the hole transport layer 4. However, the present invention is not limited thereto. In other embodiments, the position of the luminescent layer 31 and that of the sensitizer layer 32 are exchangeable. That is to say, in other embodiments, the sensitizer layer 32 can be disposed between the luminescent layer 31 and the electron transport layer 5. The sensitizer layer 32 has a sensitizer-layer triplet state, which is between the luminescent-layer singlet state and the luminescent-layer triplet state. In the present embodiment, the material of the sensitizer layer 32 is preferably (8-hydroxyquinoline) metal complex or 10-hydroxybenzo [h] quinoline-metal complex. More specifically, examples of (8-hydroxyquinoline) metal complex may include but not limited to tris(8-hydroxy)-quinoline-aluminium ($Alq_3$) and gallium 8-hydroxyquinolinat (Gaq3), and examples of 10-hydroxybenzo [h] quinoline-metal complex may include but not limited to bis(10-hydroxybenzo[h]quinolinato)beryllium. In a variant embodiment of the present embodiment, the sensitizer layer 32 can transport electron holes and acts as a hole transport layer disposed between the luminescent layer 31 and the anode 1. In another variant embodiment, the sensitizer layer 32 can transport electrons and serve as an electron transport layer disposed between the luminescent layer 31 and the cathode 2.

More specifically, with reference to FIG. 1, the organic light-emitting diode Z of the present invention further includes a guiding material 33 as a dopant of the sensitizer layer 32. The guiding material 33 has a guiding-material triplet state between the sensitizer-layer singlet state and the sensitizer-layer triplet state. In a variant embodiment, the guiding material 33 of the luminescent layered structure 3 can also be an independent material layer disposed adjacent to the sensitizer layer 32, as shown in FIG. 2. The guiding material 33 can a phosphorescent material or a thermal activated delayed fluorescence material. In one embodiment, the guiding material 33 can be an iridium complex, e.g. tris(2-phenylpyridine)iridium (Ir(ppy)3). Since the element iridium has the property of allowing energy to be transferred between the triplet state and the singlet state, the energy at the sensitizer-layer singlet state S2 can be transferred to the guiding material triplet state T3, and be further transferred to the sensitizer-layer triplet state T2. The above-mentioned exemplified materials of the guiding material 33 are merely for exemplary purpose; the present invention is not limited thereto.

The light emitting mechanism of the organic light-emitting diode of a first experimental example according to the present embodiment is described below with reference to FIG. 3, which shows an energy level diagram of the luminescent layered structure 3 of the first experimental example. In FIG. 3, the luminescent-layer singlet state S1, the luminescent-layer triplet state T1 and the luminescent-layer ground state G1 of luminescent layer 31, the sensitizer-layer singlet state S2, the sensitizer-layer triplet state T2, and the sensitizer-layer ground state G2 of the sensitizer layer 32, and the guiding-material singlet state S3, the guiding-material triplet state T3 and the guiding material 33 are shown.

As shown in FIG. 3, the triplet state T2 of the sensitizer layer 32 is between the luminescent-layer singlet state S1 and the luminescent-layer triplet state T1, and the guiding-material triplet state T3 is between the sensitizer-layer singlet state S2 and the sensitizer-layer triplet state T2. To be specific, the material of the luminescent layer 31 of the first experimental example is ADN, and that of the sensitizer layer 32 is $Alq_3$, in which the energy level of the luminescent layered structure 3 is shown in Table 1 below.

TABLE 1

|  | Sensitizer layer 32 | Guiding material 33 | Luminescent layer 32 |
|---|---|---|---|
| Singlet state (eV) | 2.8 | 2.9 | 2.83 |
| Triplet state (eV) | 2.0 | 2.4 | 1.67 |

In the present embodiment, through the technical solution that the sensitizer layer 32 doped with the guiding material 33 is disposed next to the luminescent layer 31 such that the molecules of the sensitizer layer 32 at the sensitizer-layer singlet state S2 transfer energy to the molecules of the guiding material 33 at the guiding-material triplet state T3, in which the transferred energy is further transferred to the molecules of the sensitizer layer 32 at the sensitizer-layer triplet state T2. Next, the triplet-triplet energy transfer mechanism (TTET) between the sensitizer layer 32 and the luminescent layer 31 occurs, i.e. the molecules of the sensitizer layer 32 at the sensitizer-layer triplet state T2 transfers energy to that of the luminescent layer 31 at the luminescent-layer triplet state T1. Thereafter, triplet-triplet annihilation upconversion mechanism (TTAUC) in triggered in the luminescent layer 31.

Specifically, the aforementioned TTAUC mechanism occurs among excited triplet state molecules, wherein one excited triplet state molecule transfer energy to another excited triplet state molecule and returns to the ground state, whereas the excited triplet state molecule that receives energy is raised to the singlet state. Thereafter, molecules of the luminescent layer 31 that are raised to the singlet state return to the luminescent-layer ground state G1, thereby emitting light of a first color L1.

Referring to FIG. 3, in the present embodiment, molecules of the sensitizer layer 32 at the sensitizer-layer singlet state S2 emits light of a second color L2 when returning to the sensitizer-layer ground state G2. Furthermore, in the present embodiment, white light can be generated by mixing the first color light L1, the second color light L2, light of a third color. For example, when using $Alq_3$ as the sensitizer layer 32, ADN as the luminescent layer 31 and with an added light-emitting material that emits red light, a white light can be obtained by mixing the blue light emitted by AND, the green light emitted by $Alq_3$ and the red light. However, the present invention is not limited thereto. For instance, in other embodiments, the material of the luminescent layer 31 and that of the sensitizer layer 32 are selected based on a predetermined color of light emitted by the organic light-emitting diode Z, thereby generating light of the predetermined color by mixing the first color light L1 and the second color light L2.

Through the aforementioned technical solution, the present invention enables the energy at the sensitizer-layer singlet state S2 to participate in the light-emitting mechanism of the organic light-emitting diode Z with the guiding material 33, thereby increasing the efficiency of the organic light-emitting diode Z. On the other hand, the material of the sensitizer layer 32 of the present experimental example is $Alq_3$ that emits green light, and that of the luminescent layer 31 is ADN, which emits blue light; therefore, in order to prevent the green second color light L2 emitted when molecules at the sensitizer-layer singlet state S2 return to ground state from affecting the blue first color light L1, the present embodiment enables at least part of the energy at the sensitizer-layer singlet state S2 to be transferred to the sensitizer-layer triplet state T2 through the luminescent layer 31 such that the color purity of the first color light L1 is enhanced.

It should be noted that the present invention is not limited to the above description. For instance, when in other embodiments, the predetermined emission color of the organic light-emitting diode Z is not the first color light L1, a person skilled in the art can select the material of the sensitizer layer and that of the luminescent layer according to actual needs. For instance, when in the condition that ADN which emits blue light has been determined to be the material of the luminescent layer 31, the material of the sensitizer layer 32 can be decided based on the predetermined light color of the organic light-emitting diode Z. Specifically, when in one embodiment the predetermined light color is white, a material that has a singlet state lower than the luminescent-layer singlet state S1 can be chosen as the material of the sensitizer layer 32, as in the case of the first experimental example, so that the second color light L2 is green. With doped red light-emitting material, the organic light-emitting diode Z can emit white light. When in another embodiment the predetermined light color of the organic light-emitting diode Z is blue, then a material that has a singlet state higher than the luminescent-layer singlet state S1 can be chosen to be the material of the sensitizer layer 32, as in the case of the second experimental example, so that the second color light L2 and the first light color L1 are both blue light.

In summary, the first embodiment of the present invention uses mainly the triplet energy thereof to emit light through the technical solution of the sensitizer layer 32 doped with the guiding material 33, which serves as the place the recombination between the positive polarons and the negative polarons takes place such that triplet-triplet annihilation upconversion mechanism can be triggered in the luminescent layer 31 by the triplet excitons in the sensitizer layer 32 that are generated from the recombination. Since the sensitizer layer 32 acts as the recombination zone in the present embodiment, high energy polarons in the luminescent layer 31 are prevented from reacting with the excitons. Therefore, the triplet energy in the sensitizer layer 32 can be utilized by being transferred and converted to emit light, thereby enhancing the illumination efficiency of the organic light-emitting diode Z and extending the lifetime thereof. In addition, the guiding-material triplet state T3 of the guiding material 33 is between the sensitizer-layer singlet state S2 and the sensitizer-layer triplet state T2, thereby enabling the energy at the sensitizer-layer singlet state S2 to be transferred to the guiding-material triplet state T3 of the guiding material 33, and then to the sensitizer-layer triplet state T2 of the sensitizer layer 32. In this way, the efficiency of the organic light-emitting diode Z can be enhanced. On the other hand, under the condition that the second color light L2 is different from the first color light L1, the color purity of the first color light L1 can be increased.

Second Embodiment

Figure 4:
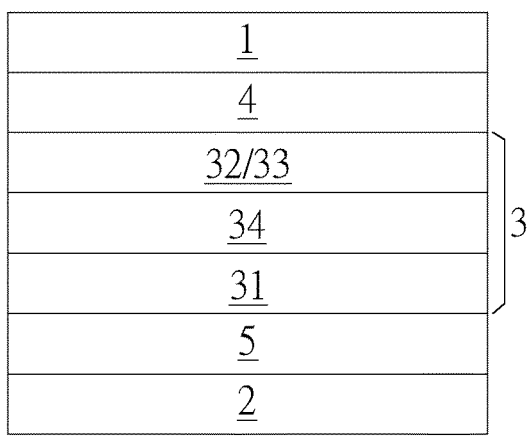
FIG. 4 is a schematic view of an organic light-emitting diode according to a second embodiment of the present invention.
Figure 5:
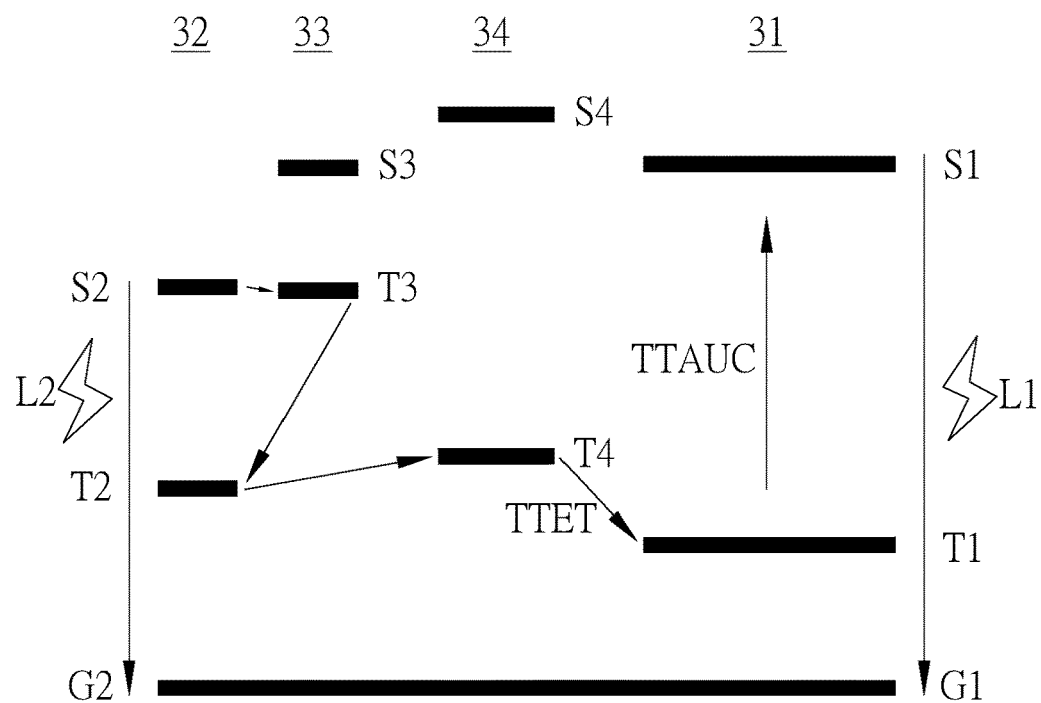
FIG. 5 illustrates an energy level diagram of the luminescent layered structure according to the second embodiment of the present invention.

Referring to FIG. 4, the main difference between the present embodiment and the first embodiment lies in that the organic light-emitting diode Z of the second embodiment further includes a blocking layer 34 between the luminescent layer 31 and the guiding-material-doped sensitizer layer 32. With reference to FIG. 5, which shows an energy level diagram of the luminescent layered structure 3 of the first experimental example according to the second embodiment, the blocking layer 34 has a blocking-layer singlet state S4 and a blocking-layer triplet state T4, in which the blocking-layer singlet state S4 is higher than the luminescent-layer singlet state S1, and the blocking-layer triplet state T4 is higher than the luminescent-layer triplet state T1.

With the blocking layer 34, the triplet energy of the sensitizer layer 32 can be transferred to the triplet state of the luminescent layer 31. At the same time, the quenching effects between the sensitizer layer 32 and the luminescent layer 31 can be reduced. In this way, the illumination efficiency of the organic light-emitting diode Z can be further improved.

Furthermore, the material of the guiding material 33 can be 1-(2'5-dimethyl-4-(1-pyrenyl)phenyl)pyrene (DMPPP) or 1,3,5-Tri(1-pyrenyl)benzene (TPB3). However, the present invention is not limited thereto. Specifically, the guiding material 33 of the present experimental example is DMPPP, and the materials of the luminescent layer 31, the sensitizer layer 32, and the guiding material 33 are ADN, $Alq_3$, and Ir(ppy)3 respectively. The energy level of FIG. 5 is shown in Table 2 below.

TABLE 2

|  | Sensitizer layer 32 | Guiding material 33 | Blocking layer 34 | Luminescent layer 31 |
|---|---|---|---|---|
| Singlet state (eV) | 2.8 | 2.9 | 3.15 | 2.83 |
| Triplet state (eV) | 2.0 | 2.4 | 2.05 | 1.67 |

Figure 6:
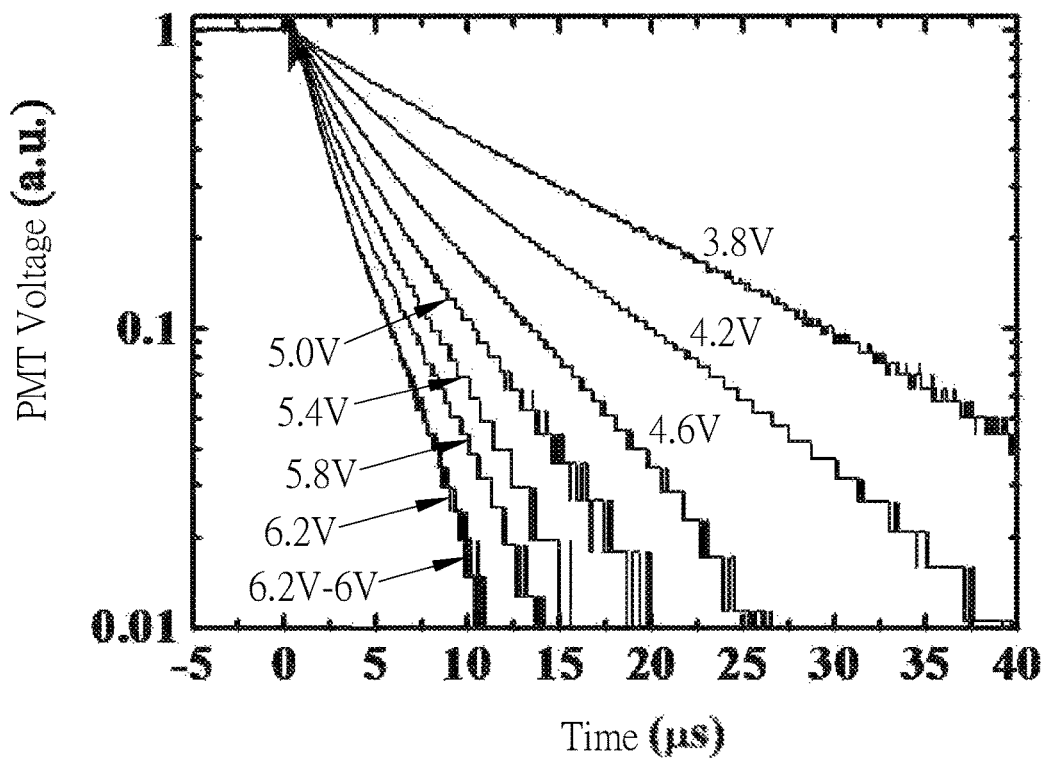
FIG. 6 illustrates the transient electroluminescence of a first experimental example according to the second embodiment of the present invention.

Please refer to FIG. 6, which shows the transient electroluminescence of the organic light-emitting diode Z of the first experimental example according to the present embodiment. Specifically, in the first experimental example, indium tin oxide (ITO) is used as the anode 1, and LiF/Al is used as the cathode 2. The thickness of the hole transport layer 4 is 50 nm, and the material thereof is N,N'-di(1-naphthyl)-N, N'-diphenyl benzidine (NPB). The thickness of the electron transport layer 5 is 65 nm, and the material thereof is 4,7-diphenyl-1,10-phenanthroline (Bphen). The thickness of the sensitizer layer 32 is 5 nm, and the material thereof is $Alq_3$. The sensitizer layer 32 is doped with 3% of the guiding material 33. The thickness of the luminescent layer 31 is 10 nm, and the material thereof is ADN. It should be noted that the above description regarding the materials used and the specifications thereof are the exemplary embodiment of the present invention; the present invention is not limited thereto.

In the experimental example shown in FIG. 6, the transient electroluminescence of the organic light-emitting diode Z is measured by first applying an electro-pulse to the organic light-emitting diode Z, and the light emitted by the organic light-emitting diode Z in response to the electro-pulse is gauged and converted into electric output with a photomultiplier. The curves shown in FIG. 6 respectively represent the electric signals outputted by the organic light-emitting diode Z in response to an input voltage of 3.8 V, 4.2 V, 4.6 V, 5.0 V, 5.4 V, 5.8 V, and 6 V-6.2 V. As shown in FIG. 6, when each applied voltage is turned off at 0 second, the speed at which the organic light-emitting diode Z of the first experimental example emits light is of microsecond-scale. In general, the speed at which singlet excitons emit light is of nanosecond-scale, and that of triplet excitons is of microsecond-scale since triplet excitons decay slower owing to the spin conservation. This is due to the delay rate of triplet excitons being slower. That is to say, FIG. 6 shows that in the first experimental example the triplet excitons contribute to nearly 100% of the total emission.

Figure 7:
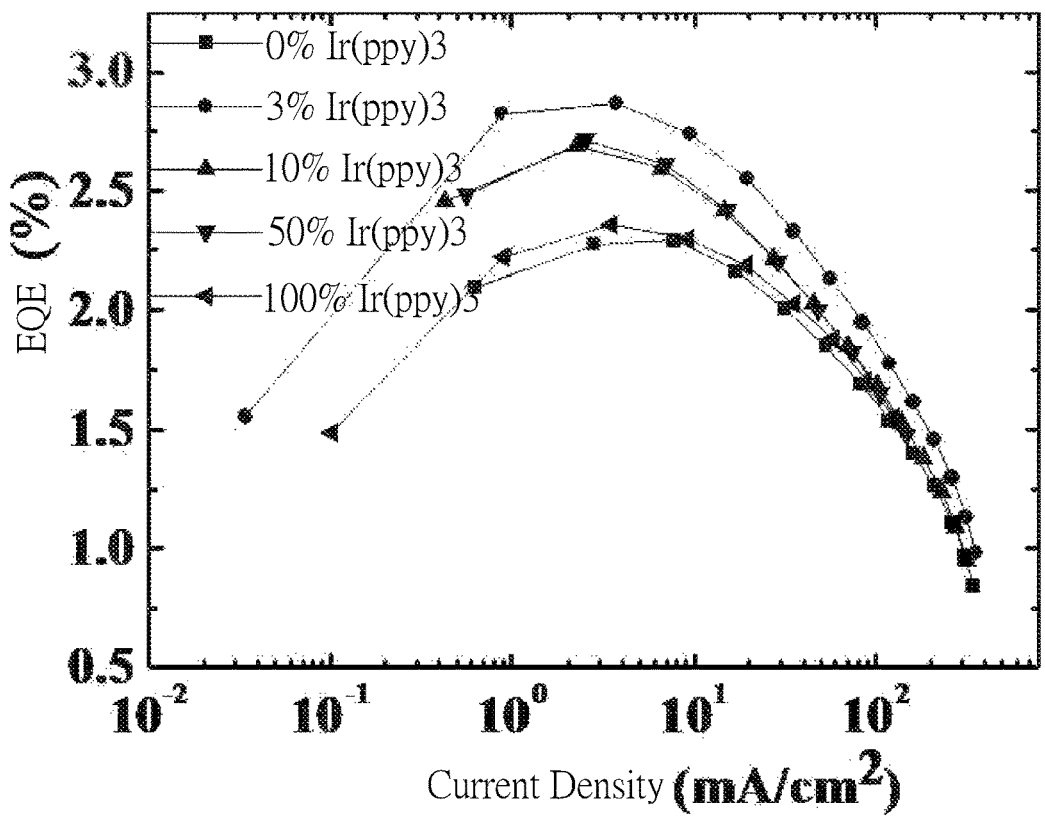
FIG. 7 illustrates the external quantum efficiency of the first experimental example, a second experimental example, a third experimental example, a first comparative example and a second comparative example across an operative range of current density according to the second embodiment of the present invention.

FIG. 7 shows a diagram illustrating the external quantum efficiency of the first experimental example (the sensitizer layer 32 doped with 3% of the guiding material 33, shown with the curve marked as 3% Ir(ppy)3), the second experimental example (the sensitizer layer 32 doped with 10% of the guiding material 33, shown with the curve marked as 10% Ir(ppy)3), the third experimental example (the sensitizer layer 32 doped with 50% of the guiding material 33, shown with the curve marked as 50% Ir(ppy)3), a first comparative example (the sensitizer layer 32 without dopant, shown with the curve marked as 0% Ir(ppy)3), and a second comparative example (the sensitizer layer 32 is replaced by the guiding material 33, shown with the curve marked as 100% Ir(ppy)3) according to the second embodiment of the present invention. The difference between the first experimental example and the second experimental example, the third experimental, the first comparative example, and the second comparative example lies in the dopant concentration, and other parameters are the same. As shown in FIG. 7, the first experimental example, the second experimental example, and the third experimental in which the sensitizer layer 32 is doped with a certain percentage of the guiding material 33 exhibit higher external quantum efficiencies compared to the first comparative example in which the sensitizer layer 32 is not doped with the guiding material 33, and the second comparative example in which the guiding material 33 replaces the sensitizer layer 32, wherein the first experimental example of a dopant concentration of 3% has the highest efficiency. The result is due to the effect that the energy at the sensitizer-layer singlet state S2 of the sensitizer layer 32 is transferred to the sensitizer-layer triplet state T2 of the sensitizer layer 32 through the guiding material 33, and then participates in the light-emitting mechanism through the triplet triplet energy transfer (TTET) and the triplet-triplet annihilation upconversion (TTAUC) together with the molecules of the sensitizer layer 32 at the sensitizer-layer triplet state T2 in the first place.

Figure 8:
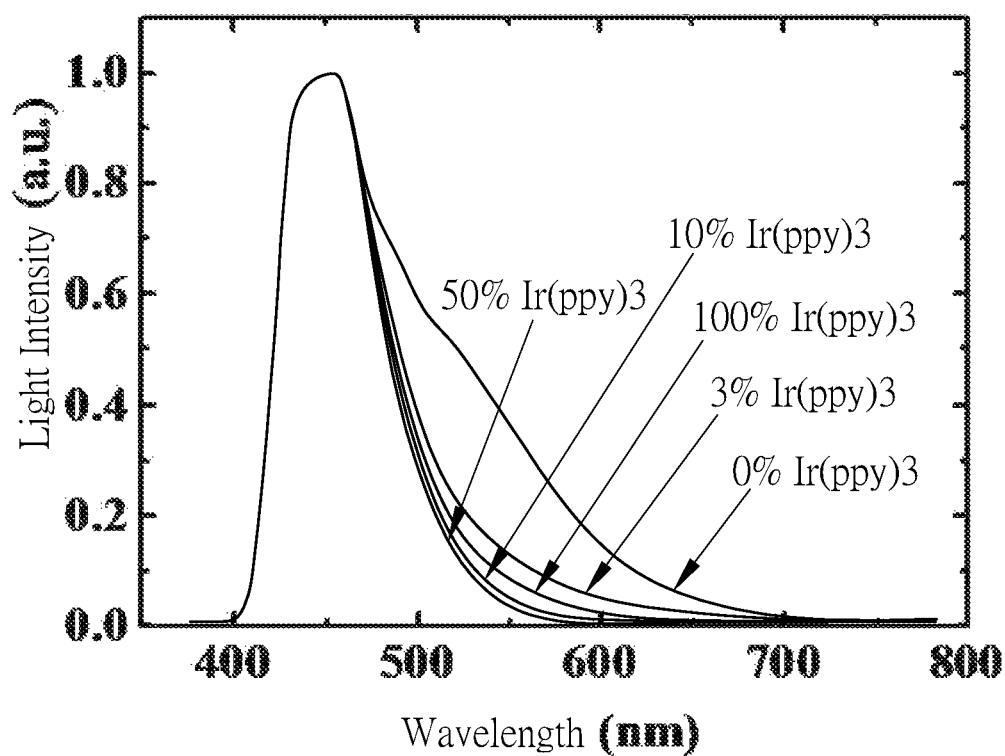
FIG. 8 illustrates the light intensity of the first experimental example, the second experimental example, the third experimental, the first comparative example, and the second comparative example across the wavelength range from 350 nm to 800 nm according to the second embodiment of the present invention.

Please refer to FIG. 8, which shows a light intensity diagram of the first experimental example to the third experimental example, the first comparative example and the second comparative example across a range of wavelength. As shown in the figure, the first comparative example, which contains no guiding material 33 as a dopant has higher light intensity at the wavelength range of 495~570 nm compared to the first experimental example, the second experimental example, the third experimental, and the second comparative example in which the sensitizer layer 32 is doped with the guiding material 33. This is due to the guiding material 33 as a dopant guides the energy at the sensitizer-layer singlet state S2 to the sensitizer-layer triplet state T2. Moreover, it can be seen from the figure that the higher the dopant concentration of the guiding material 33, the higher the color purity of the first color light L1, which is blue light emitted by ADN.

Please further refer to FIG. 8. When the guiding material 33 replaces the sensitizer layer 32, which is the case of the second comparative example, the color purity of the second comparative example is still higher than that of the first comparative example, which is mainly because the element iridium in Ir(ppy)3 allows energy to be transferred from the singlet state to the triplet state and vice versa. As a result, the energy of the guiding-material singlet state S3 can be transferred to the guiding-material triplet state T3, and further participates in the light-emitting mechanism through taking part in the triplet-triplet energy transfer (TTET).

In summary, the embodiments of the present invention achieves "the molecules of the sensitizer layer at the sensitizer-layer singlet state transfer energy to the molecules of the guiding material at the guiding-material triplet state, in which the transferred energy is further transferred to the molecules of the sensitizer layer at the sensitizer-layer triplet state" through the technical solutions of "the luminescent layered structure includes the guiding material" and "the guiding-material triplet state is between the sensitizer-layer singlet state and the sensitizer-layer triplet state".

Through the aforementioned technical solutions, the organic light-emitting diode Z of the present embodiments utilizes the guiding-material triplet state T3 of the guiding material 33 to transfer energy from the sensitizer-layer singlet state S2 to the sensitizer-layer triplet state T2 so that the energy at the sensitizer-layer singlet state S2 can contribute to light emission, thereby enhancing the efficiency of the organic light-emitting diode Z and increasing the color purity of the first color light L1. Next, the sensitizer layer 32 performs triplet-triplet energy transfer with the luminescent layer 31, thereby triggering triplet-triplet annihilation upconversion mechanism in the luminescent layer 31. In this way, triplet energy of the luminescent layer 31 and that of the sensitizer layer 32 can be converted into light emitted by the organic light-emitting diode Z, thereby effectively enhancing the illumination efficiency and lifespan of the organic light-emitting diode Z.

In addition, in some embodiments, a blocking layer 34 can be added in the organic light-emitting diode Z, in which the singlet state of the blocking layer 34 is higher than that of the luminescent layer 31, and the triplet state of the blocking layer 34 is higher than that of the luminescent layer 31. In this way, the illumination efficiency of the organic light-emitting diode Z can be further increased.

The present invention has been described with reference to the above embodiments, but the above embodiments are merely examples for implementing the present invention. It should be noted that the disclosed embodiments are not intended to limit the scope of the present invention. On the contrary, any modification and equivalent configuration within the spirit and scope of the appended claims shall fall within the scope of the present invention.

What is claimed is:

1. An organic light-emitting diode, comprising:
an anode;
a cathode; and
a luminescent layered structure disposed between the anode and the cathode, including
a luminescent layer having a luminescent-layer ground state, a luminescent-layer singlet state and a luminescent-layer triplet state, in which the luminescent-layer singlet state is two times higher than the luminescent-layer triplet state;
a sensitizer layer having a sensitizer-layer singlet state and a sensitizer-layer triplet state, which is between the luminescent-layer singlet state and the luminescent-layer triplet state, and
a guiding material having a guiding-material triplet state between the sensitizer-layer singlet state and the sensitizer-layer triplet state,
wherein molecules of the sensitizer layer at the sensitizer-layer singlet state transfer energy to molecules of the guiding material at the guiding-material triplet state, in which the transferred energy is further transferred to the molecules of the sensitizer layer at the sensitizer-layer triplet state,
wherein the molecules of the sensitizer layer at the sensitizer-layer triplet state transfers energy to molecules of the luminescent layer at the luminescent-layer triplet state and triggers triplet-triplet annihilation upconversion in the luminescent layer such that the luminescent layer emits light of a first color.

2. The organic light-emitting diode according to claim 1, wherein the guiding material is a dopant in the sensitizer layer.

3. The organic light-emitting diode according to claim 1, wherein the guiding material forms a guiding material layer, in which the sensitizer layer is situated between the guiding material layer and the luminescent layer.

4. The organic light-emitting diode according to claim 1, wherein the guiding material is one of a phosphorescent material and a thermally activated delayed fluorescence material.

5. The organic light-emitting diode according to claim 4, wherein the guiding material is an iridium complex.

6. The organic light-emitting diode according to claim 1, further comprising:

a hole transport layer disposed between the anode and the luminescent layered structure; and
an electron transport layer disposed between the cathode and the luminescent layered structure.

7. The organic light-emitting diode according to claim 1, wherein the sensitizer layer is an electron transport layer, and the organic light-emitting diode further comprises a hole transport layer disposed between the anode and the luminescent layered structure.

8. The organic light-emitting diode according to claim 1, wherein the sensitizer layer is a hole transport layer, and the organic light-emitting diode further comprises an electron transport layer disposed between the cathode and the luminescent layered structure.

9. The organic light-emitting diode according to claim 1, wherein the sensitizer layer includes one of a (8-hydroxyquinoline) metal complex and a 10-hydroxybenzo [h] quinoline-metal complex.

10. The organic light-emitting diode according to claim 9, wherein the sensitizer layer includes one of a tris(8-hydroxyquinoline)aluminum and bis(10-hydroxybenzo[h]quinolinato)beryllium.

11. The organic light-emitting diode according to claim 1, wherein the sensitizer layer includes 1-(2,5-dimethyl-4-(1-pyrenyl)phenyl)pyrene.

12. The organic light-emitting diode according to claim 1, wherein the luminescent layer is selected from the group consisting of an anthracene derivative, a pyrene derivative and a perylene derivative.

13. The organic light-emitting diode according to claim 12, wherein the anthracene derivative is selected from the group consisting of 9,10-Di(2-naphthyl)anthracene, 2-methyl-9,10-D(2-naphthyl)anthracene, 2-tert-butyl-9,10-Di(2-naphthyl)anthracene, and 9,9'-dianthracene.

14. The organic light-emitting diode according to claim 1, wherein the sensitizer layer further includes a sensitizer-layer singlet state and a sensitizer-layer ground state, in which the molecules of the sensitizer layer at the sensitizer-layer singlet state returns to the sensitizer-layer ground state and emits light of a second color.

15. The organic light-emitting diode according to claim 14, wherein a white light can be generated by mixing light of the first color and light of the second color.

16. The organic light-emitting diode according to claim 1, wherein the luminescent layered structure further includes a blocking layer disposed between the sensitizer layer and the luminescent layer, in which the blocking layer has a blocking-layer singlet state and a blocking layer triplet state, the blocking-layer singlet state being higher than the luminescent-layer singlet state, and the blocking-layer triplet state being higher than the luminescent-layer triplet state.

17. The organic light-emitting diode according to claim 16, wherein the blocking layer is selected from the group consisting of 1-(2,5-dimethyl-4-(1-pyrenyl)phenyl)pyrene and 1,3,5-Tri(1-pyrenyl)benzene.

* * * * *